US012185578B2

(12) United States Patent
Pang et al.

(10) Patent No.: US 12,185,578 B2
(45) Date of Patent: Dec. 31, 2024

(54) DISPLAY DEVICE

(71) Applicant: LG Display Co., Ltd., Seoul (KR)

(72) Inventors: Heesuk Pang, Paju-si (KR); Suk Yang, Seoul (KR); Joohwan Shin, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 560 days.

(21) Appl. No.: 17/470,819

(22) Filed: Sep. 9, 2021

(65) Prior Publication Data

US 2022/0085318 A1   Mar. 17, 2022

(30) Foreign Application Priority Data

Sep. 11, 2020 (KR) .......................... 10-2020-0117071

(51) Int. Cl.
*H10K 50/87* (2023.01)
*H05K 5/00* (2006.01)
*H05K 5/04* (2006.01)
*H10K 50/842* (2023.01)
*H10K 102/00* (2023.01)

(52) U.S. Cl.
CPC ........... *H10K 50/87* (2023.02); *H05K 5/0017* (2013.01); *H05K 5/04* (2013.01); *H10K 50/8426* (2023.02); *H10K 2102/311* (2023.02)

(58) Field of Classification Search
None
See application file for complete search history.

(56) References Cited

U.S. PATENT DOCUMENTS

| | | | |
|---|---|---|---|
| 10,001,665 B2 | 6/2018 | Kwon et al. | |
| 10,345,858 B2 | 7/2019 | Han et al. | |
| 10,517,173 B2 | 12/2019 | Kim | |
| 10,921,856 B2 | 2/2021 | Han et al. | |
| 10,993,337 B2 | 4/2021 | Shin et al. | |
| 11,379,018 B2 | 7/2022 | Na et al. | |
| 11,467,625 B2 | 10/2022 | Ryu et al. | |
| 2018/0027671 A1* | 1/2018 | Kang | H05K 5/0213 361/707 |
| 2019/0069425 A1* | 2/2019 | Ryu | H10K 50/84 |
| 2020/0196492 A1* | 6/2020 | Kim | G02F 1/13452 |
| 2020/0245071 A1* | 7/2020 | Won | H04R 9/06 |
| 2022/0365554 A1 | 11/2022 | Ryu et al. | |

FOREIGN PATENT DOCUMENTS

| | | |
|---|---|---|
| KR | 10-2016-0141058 A | 12/2016 |
| KR | 10-2017-0026021 A | 3/2017 |
| KR | 10-2018-0062269 A | 6/2018 |
| KR | 10-2020-0010821 A | 1/2020 |
| KR | 10-2020-0012639 A | 2/2020 |
| KR | 10-2020-0053354 A | 5/2020 |
| KR | 20200094867 A * | 8/2020 |

* cited by examiner

*Primary Examiner* — Xanthia C Relford
(74) *Attorney, Agent, or Firm* — Birch, Stewart, Kolasch & Birch, LLP (57) ABSTRACT

Discussed is a display device capable of improving heat dissipation performance. The display device includes a display panel, and a back cover to support the display panel, wherein the back cover includes a first back cover stacked on the display panel and a second back cover stacked on the first back cover, where the back cover has thermal conductivity.

24 Claims, 10 Drawing Sheets

DISPLAY DEVICE

CROSS-REFERENCE TO RELATED APPLICATION

This application claims the priority benefit under 35 U.S.C. § 119(a) to Korean Patent Application No. 10-2020-0117071 filed on Sep. 11, 2020, in the Korean Intellectual Property Office, the entire contents of which are expressly incorporated herein by reference for all purposes into the present application.

BACKGROUND OF THE INVENTION

Field of the Invention

The present disclosure relates to a display device. More specifically, the present disclosure relates to a display device having improved heat dissipation performance.

Description of Related Art

As the information society develops, the demand for display devices is increasing in various forms. In response to this demand, display devices having various display panels such as liquid crystal display panels, plasma display panels, and organic light-emitting display panels are being researched and commercialized.

An organic light-emitting display device having an organic light-emitting display panel is a self-luminous display device. Unlike the display devices with the liquid crystal display panels, the organic light-emitting display device does not require a separate light source, and thus can be manufactured to be relatively light and thin. Further, the organic light-emitting display device is capable of operate at a low voltage, has excellent characteristics in terms of color rendering, a response speed, a viewing angle, a contrast ratio, etc., and thus has been widely used in recent years.

However, the organic light-emitting elements or organic light emitting materials used in the organic light-emitting display panels can be more vulnerable to heat than the liquid crystal materials are. Thus, heat dissipation ability is important in the organic light-emitting display device. In general organic light-emitting display devices, a back cover that supports a rear of the organic light-emitting display panel and an inner plate that is attached to an inner surface of the back cover to reinforce rigidity of the back cover and function as a heat dissipation member may be used. However, in a related-art support structure composed of the back cover and the inner plate, a thickness of the back cover or inner plate can be large to secure the rigidity of the support structure. In that case, the heat dissipation through the inner plate may not be sufficient.

SUMMARY OF THE INVENTION

Accordingly, the inventors of the present disclosure have invented a support structure of an organic light-emitting display panel that can improve the heat dissipation performance while reducing a manufacturing cost of the device.

A purpose of one embodiment of the present disclosure is to provide a display device capable of improving the heat dissipation performance while reducing a manufacturing cost thereof.

Further, a purpose of one embodiment of the present disclosure is to provide a display device that can prevent external moisture from permeating into a display panel and can implement a narrow bezel structure.

Purposes in accordance with the present disclosure are not limited to the above-mentioned purpose. Other purposes and advantages in accordance with the present disclosure as not mentioned above can be understood from following descriptions and more clearly understood from embodiments in accordance with the present disclosure. Further, it will be readily appreciated that the purposes and advantages in accordance with the present disclosure can be realized by features and combinations thereof as disclosed in the claims.

According to one aspect of the present disclosure for achieving the above-described technical purpose, a display device capable of improving heat dissipation performance can be provided. The display device includes a display panel and a back cover to support the display panel, wherein the back cover includes a first back cover stacked on the display panel and a second back cover stacked on the first back cover. The back cover has thermal conductivity.

According to one embodiment of the present disclosure, the first back cover is attached to the display panel via a first adhesive member, and the second back cover has a smaller area than an area of the first back cover, and is attached to the first back cover via a second adhesive member.

According to one embodiment of the present disclosure, the first adhesive member includes a heat dissipation material.

According to one embodiment of the present disclosure, the display device further comprises a connector for connecting a portion of the first back cover and a portion of the second back cover.

According to one embodiment of the present disclosure, the first back cover, the second back cover and the connector are integrally formed with each other.

According to one embodiment of the present disclosure, the connector is located adjacent to a lower end of the display panel, wherein a bottom of the connector protrudes downwardly beyond a lower end of the display panel.

According to one embodiment of the present disclosure, the connector is bent, and at least one corrugation is formed on an inner surface of a bent portion of the connector.

According to one embodiment of the present disclosure, the first back cover includes an inner region attached to the display panel, and an edge region surrounding a portion of edges of the display panel, wherein the device further comprises a sealing member for preventing moisture permeation disposed between the display panel and the edge of the first back cover.

According to one embodiment of the present disclosure, a source printed circuit board is attached to the first back cover, while a control printed circuit board is attached to the second back cover.

According to one embodiment of the present disclosure, the second back cover does not cover the source printed circuit board, wherein a signal cable for connecting the control printed circuit board and the source printed circuit board to each other passes by a lower end of the second back cover.

According to one embodiment of the present disclosure, the second back cover covers the source printed circuit board, and has at least one through-hole defined therein, wherein a signal cable for connecting the control printed circuit board and the source printed circuit board to each other passes through the through-hole.

According to one embodiment of the present disclosure, each of upper and lower ends of the through-hole has a curvature.

According to one embodiment of the present disclosure, the through-hole extends in an inclined manner relative to a top surface and a bottom surface of the second back cover.

According to one embodiment of the present disclosure, the back cover is made of: aluminum, copper, or an alloy thereof; or a clad metal in which aluminum, copper, or an alloy thereof is laminated; or a steel plate material including galvanized steel, aluminum plated steel, or galvalume steel.

According to one embodiment of the present disclosure, the back cover is made of a PCM (Pre-Coated Metal) material as a color steel plate material obtained by coating a resin on the steel plate material or attaching a film on the steel plate material.

According to another aspect of the present disclosure, a display device includes a display panel and a back cover having thermal conductivity. The back cover includes a first back cover having an inner region attached to the display panel via a first adhesive member, and an edge region surrounding a portion of edges of the display panel. The back cover further includes a second back cover attached to a rear surface of the first back cover via a second adhesive member. The display device further includes a connector located adjacent to a lower end of the display panel, wherein the connector connects a portion of the first back cover and a portion of the second back cover to each other, where the first back cover, the second back cover and the connector are integrally formed with each other.

According to one embodiment of the present disclosure, an area of the second back cover is smaller than an area of the first back cover.

According to one embodiment of the present disclosure, a lower end of the connector protrudes downwardly beyond a lower end of the display panel.

According to one embodiment of the present disclosure, the connector is bent, and at least one corrugation is formed on an inner surface of a bent portion of the connector.

According to one embodiment of the present disclosure, the display device further comprises a sealing member for preventing moisture permeation disposed between top and right and left edges of the display panel and the edge region of the first back cover.

According to one embodiment of the present disclosure, a source printed circuit board is attached to the first back cover, while a control printed circuit board is attached to the second back cover.

According to one embodiment of the present disclosure, the second back cover does not cover the source printed circuit board, wherein a signal cable connecting the control printed circuit board and the source printed circuit board to each other passes by a lower end of the second back cover.

According to one embodiment of the present disclosure, the second back cover covers the source printed circuit board, and has at least one through-hole defined therein, wherein a signal cable for connecting the control printed circuit board and the source printed circuit board to each other passes through the through-hole.

According to one embodiment of the present disclosure, each of upper and lower ends of the through-hole has a curvature.

According to one embodiment of the present disclosure, the through-hole extends in an inclined manner relative to a top surface and a bottom surface of the second back cover.

According to one embodiment of the present disclosure, the first adhesive member includes a heat dissipation material.

According to one embodiment of the present disclosure, since the back cover having thermal conductivity supports the display panel, a display device capable of improving heat dissipation performance can be provided.

Further, according to one embodiment of the present disclosure, since the first back cover and the second back cover form a stacked structure, the back cover having high flexural stiffness can be provided.

Further, according to one embodiment of the present disclosure, since the second back cover has a smaller area than that of the first back cover, the high flexural stiffness can be maintained while a total weight of the back cover can be reduced.

Further, according to one embodiment of the present disclosure, since the back cover supports the display panel and performs the dissipation of the heat at the same time, there is no need for a separate inner plate which is needed in the related art to support the display panel and perform the dissipation of heat. Therefore, according to one embodiment of the present disclosure, the structure supporting the display panel is simplified. The manufacturing cost of the device can be reduced due to the reduction in the number of parts thereof.

Further, according to one embodiment of the present disclosure, the display device includes the connector located adjacent to the lower end of the display panel. A lower end of the connector protrudes downwardly beyond the lower end of the display panel. Thus, even when the display device collides with a ground while handling the display device, it is possible to prevent the display panel from directly colliding with the ground and thus being damaged. The flexible film extending to surround the lower end of the display panel in order to connect the source printed circuit board and the display panel to each other can be prevented from colliding with the ground directly and thus being damaged.

Effects of the present disclosure are not limited to the above-mentioned effects, and other effects as not mentioned will be clearly understood by those skilled in the art from following descriptions.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE EMBODIMENTS

Advantages and features of the present disclosure, and a method of achieving the Advantages and features will become apparent with reference to embodiments described later in detail together with the accompanying drawings. However, the present disclosure is not limited to embodiments as disclosed below, but can be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

In descriptions of temporal relationships, for example, temporal precedent relationships between two events such as "after", "subsequent to", "before", etc., another event can occur therebetween unless "directly after", "directly subsequent" or "directly before" is indicated.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section, and may not define order. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, various embodiments of the present disclosure directed to a display device will be described in detail with reference to the attached drawing. All the components of each display device according to all embodiments of the present disclosure are operatively coupled and configured.

Figure 1:
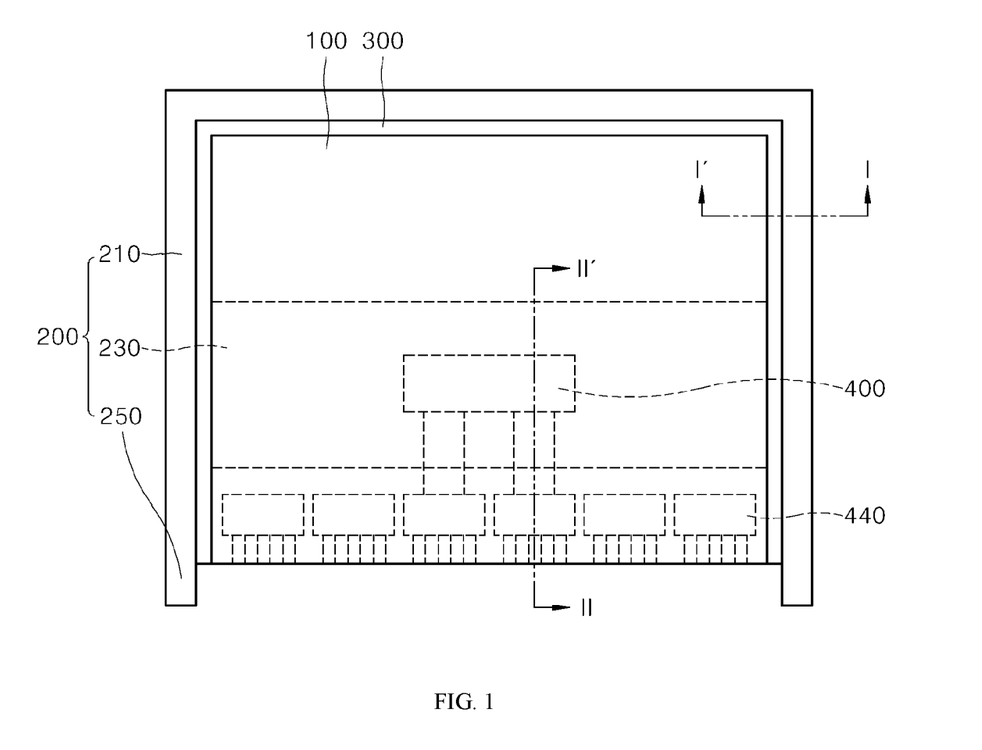
FIG. 1 is a plan view showing a display device according to one embodiment of the present disclosure.
Figure 2:
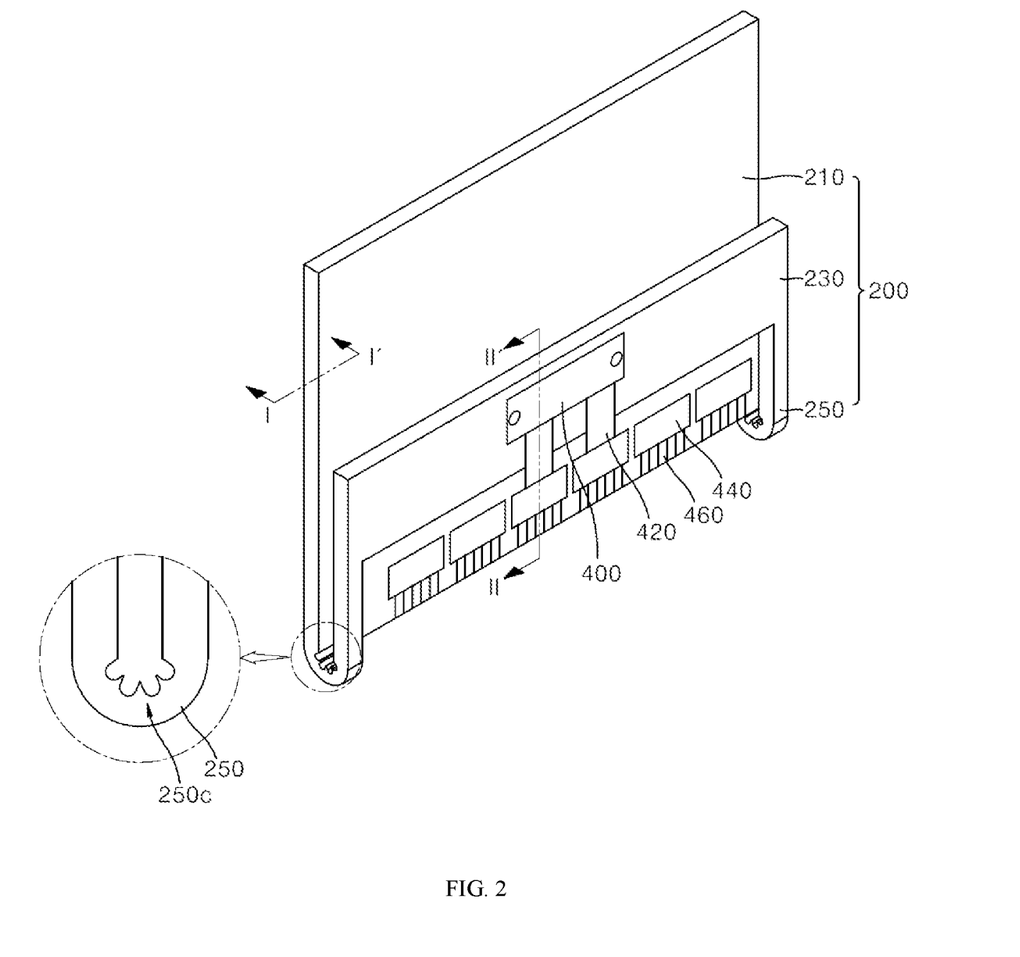
FIG. 2 is a perspective view showing the display device according to the one embodiment of the present disclosure.
Figure 3:
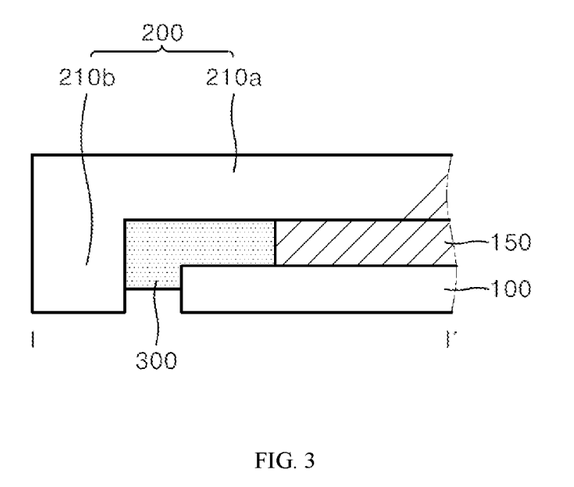
FIG. 3 and FIG. 4 are cross-sectional views of the display device cut along a I-I' cutting line and a II-IP cutting line of FIG. 1 and FIG. 2, respectively.
Figure 4:
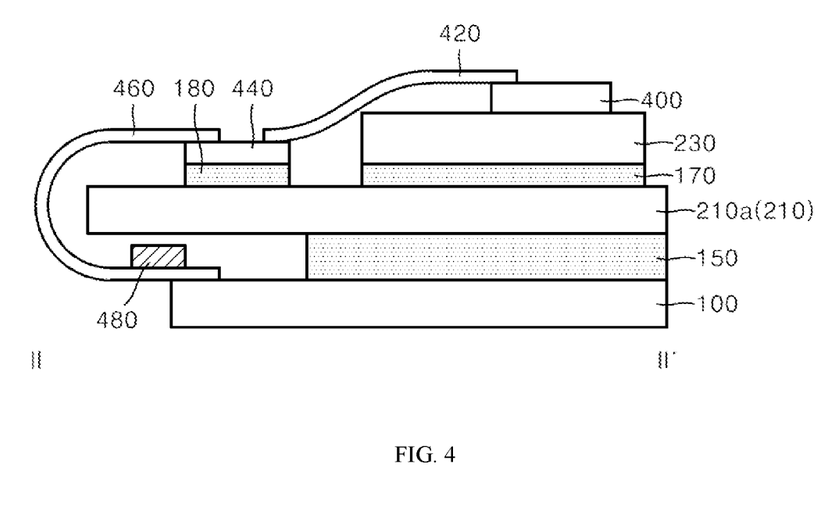
Figure 5:
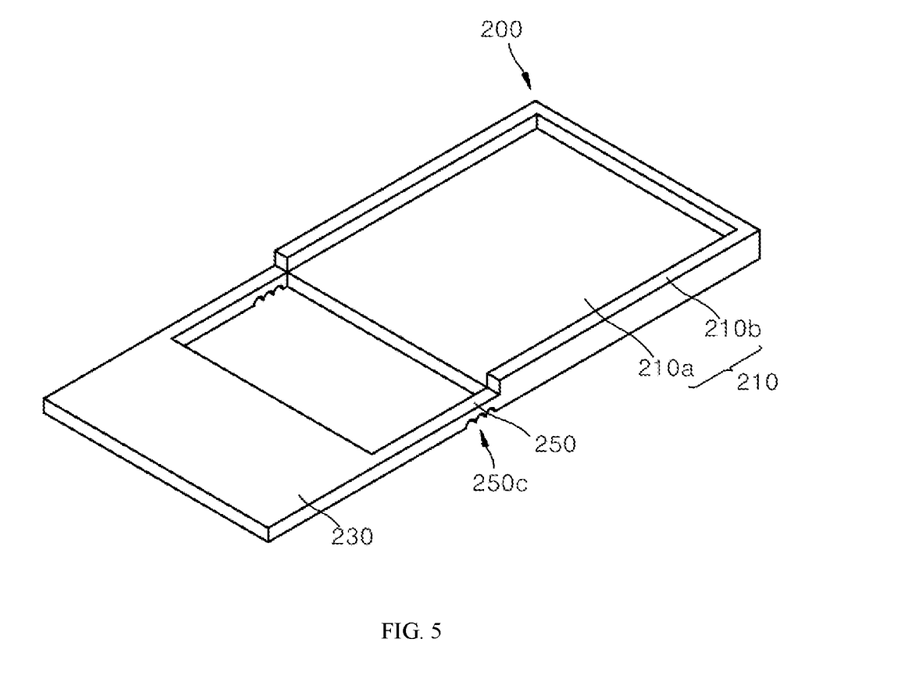
FIG. 5 is a perspective view showing an unfolded state of a back cover according to one embodiment of the present disclosure.

FIG. 1 is a plan view showing a display device according to one embodiment of the present disclosure. FIG. 2 is a perspective view showing the display device according to the one embodiment of the present disclosure. FIG. 3 and FIG. 4 are cross-sectional views of the display device cut along a I-I' cutting line and a II-II' cutting line of FIG. 1 and FIG. 2, respectively. FIG. 5 is a perspective view showing an unfolded state of the back cover according to one embodiment of the present disclosure.

Referring to FIG. 1 to FIG. 4, the display device according to the one embodiment of the present disclosure can include a display panel 100, and a back cover 200 having thermal conductivity that supports the display panel 100 and dissipates heat. In one embodiment of the present disclosure, the back cover 200 can include a first back cover 210 and a second back cover 230 sequentially stacked on the display panel 100, and a connector 250 that connects a portion of the first back cover 210 and a portion of the second back cover 230 to each other. The first back cover 210, the second back cover 230, and the connector 230 can be integrally formed with each other.

Although it is illustrated and described that the connector is used to connect the first and second back cover, and the first back cover, the second back cover and the connector are integrally formed with each other, it is also possible to omit the connector and configure the first back cover and the second back cover to be separate parts. For example, the first back cover and the second back cover can be made separately and attached to each other by adhesive without the connector. In the following description, we will mainly describe the display device with the connector, but the present disclosure is not limited thereto.

The first back cover 210 can be attached to the display panel 100 via a first adhesive member 150. The second back cover 230 which has an area smaller than that of the first back cover 210 can be attached to a rear surface of the first back cover 210 via a second adhesive member 170.

The back cover 200 can be made of a metal having good thermal conductivity or a material including a metal. For example, the back cover 200 can be made of a metal such as aluminum or copper, an alloy thereof, or a clad metal in which aluminum or copper, an alloy thereof is laminated. However, the present disclosure is not limited thereto.

Further, for example, the back cover 200 can be made of a steel plate material such as an electro-galvanized steel sheet, a hot-dip galvanized steel sheet, a galvalume steel sheet, and an aluminum-plated steel sheet. In addition, for example, the back cover 200 can be made of a PCM (Pre-Coated Metal) material as a color steel plate material obtained by coating a polyester resin on the steel plate material or attaching a laminate film thereon. However, the present disclosure is not limited thereto.

According to one embodiment of the present disclosure, heat generated from the display panel 100 during the operation of the display device can be easily discharged to the outside through the back cover 200 having good thermal conductivity that supports the display panel 100. Further, according to one embodiment of the present disclosure, since the first back cover 210 and the second back cover 230 form a stacked structure, the back cover 200 can have high flexural stiffness. Further, according to one embodiment of the present disclosure, since the second back cover 230 has a smaller area than that of the first back cover 210, the high flexural stiffness can be maintained while the overall weight of the back cover 200 can be reduced.

Further, according to one embodiment of the present disclosure, since the back cover 200 supports the display panel 100 and performs the dissipation of heat at the same time, there is no need for a separate inner plate to support the display panel 100 and perform the dissipation heat which is required in the prior art. Therefore, according to one embodiment of the present disclosure, the structure supporting the display panel 100 can be simplified. The manufacturing cost of the display device can be reduced due to the reduction in the number of parts of the display device.

The first adhesive member 150 can include a heat dissipation material. Therefore, heat dissipation through the back cover 200 according to one embodiment of the present disclosure can be made more efficiently.

The connector 250 can be located adjacent to the lower end of the display panel 100. The lower end of the connector 250 protrudes downwardly beyond the lower end of the display panel 100. While handling the display device, the display device can collide with the ground, etc. In this case, the connector 250 protruding downwardly beyond the lower end of the display panel 100 can prevent the display panel 100 from directly colliding with the ground and being damaged.

The connector 250 can be bent. At least one corrugation 250c is formed on an inner surface of the bent portion of connector 250. Due to at least one corrugation 250c, the connector 250 can be easily bent, and attaching the second back cover 230 to the first back cover 210 can be easily performed.

The display device according to one embodiment of the present disclosure can include a source printed circuit boards 440 attached to the first back cover 210 and a control printed circuit board 400 attached to the second back cover 230. The source printed circuit boards 440 can be attached to a back surface of the first back cover 210 by means of a third adhesive member 180. Moreover, the control printed circuit board 400 can be fixed to a back surface of the second back cover 230 via screws or the like. In this case, the second back cover 230 can include holes into which screws, etc. can be inserted.

The source printed circuit boards 440 can be connected to data lines located on the display panel 100 in a COF (Chip On Film) or TCP (Tape Carrier Package) scheme. Signal lines for transmitting various signals can be formed on the source printed circuit boards 440. A source drive IC 480 can be mounted on a flexible film 460. One end of the flexible film 460 can be connected to the display panel 100, while the opposite end of the flexible film 460 can be connected to the source printed circuit board 440. The source printed circuit board 440 can be connected to the display panel 100 via at least one flexible film 460. The flexible film 460 can wrap the lower end of the first back cover 210 and extend from the display panel 100 toward the source printed circuit board 440.

While handling the display device, the device can collide with the ground, etc. In this case, the connector 250 protruding downwardly beyond the lower end of the display panel 100 can prevent the flexible film 460 extending to wrap the lower of the first back cover 210 from colliding directly with the ground, etc. and being damaged thereby.

The control printed circuit board 400 can be connected to at least one source printed circuit board 440 via a signal cable 420 such as a FFC (Flexible Flat Cable) or a FPC (flexible printed circuit). A timing controller that generates and supplies timing control signals to be transmitted to the source drive IC 480, etc. can be mounted on the control printed circuit board 400. In one embodiment of the present disclosure, the second back cover 230 does not cover the source printed circuit boards 440. The signal cable 420 connecting the control printed circuit board 400 and the source printed circuit board 440 to each other can pass by the lower end of the second back cover 230.

Referring to FIG. 5, it may be better appreciated that the first back cover 210, the second back cover 230, and the connector 250 of the back cover 200, are integrally formed with each other. The first back cover 210 includes an inner region 210a attached to the display panel 100 and an edge region 210b surrounding a portion of edges of the display panel 100. The edge region 210b can surround three edges, upper, left, and right edges of the display panel 100. To this end, a thickness of the edge region 210b is larger than that of the inner region 210a. The second back cover 230 can be connected to the first back cover 210 via the connectors 250. The connectors 250 respectively connects left/right edge areas of the first back cover 210 to left/right edge areas of the second back cover 230. The second back cover 230 has a smaller area than that of the first back cover 210. The back cover 200 can be manufactured, for example, by processing a plate of metal material using a press, etc.

The display device according to one embodiment of the present disclosure can further include a sealing member 300 for preventing moisture permeation provided between the display panel 100 and the edge region 210b of the first back cover 210. The sealing member 300 can be made of an organic material such as epoxy, acrylic and silicone containing an optically curable material or a thermally curable material.

Further, the sealing member 300 further contains moisture absorbing particles made of talc, calcium oxide (CaO), barium oxide (BaO), zeolite, and silicon oxide (SiO). The sealing member 300 can further contain a curing retardant. The sealing member can seal between the display panel 100 and the edge region 210b of the first back cover 210 without affecting the display panel 100. Moreover, the sealing member 300 can further contain pigments or dyes to render a variety of colors.

The display device according to one embodiment of the present disclosure effectively prevents external moistures from permeating into the display panel 100 using the sealing member 300 for preventing moisture permeation provided between the display panel 100 and the edge 210b of the first back cover 210. Thus, a size of an effective bezel can be reduced, and thus a narrow bezel can be implemented.

Figure 6:
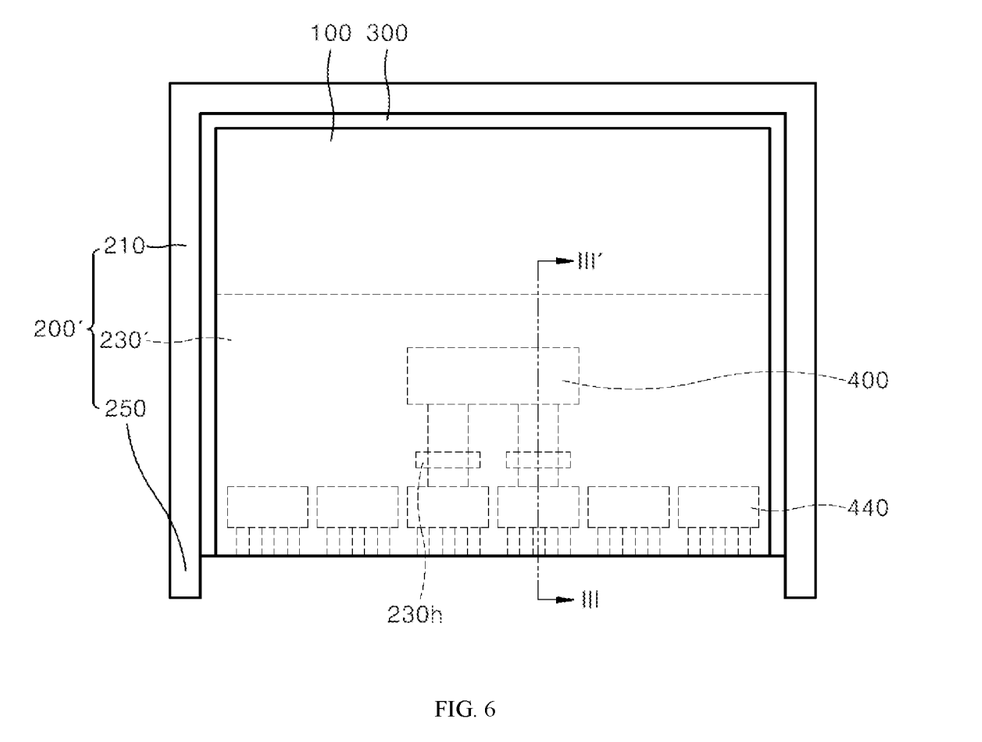
FIG. 6 is a plan view showing a display device according to another embodiment of the present disclosure.
Figure 7:
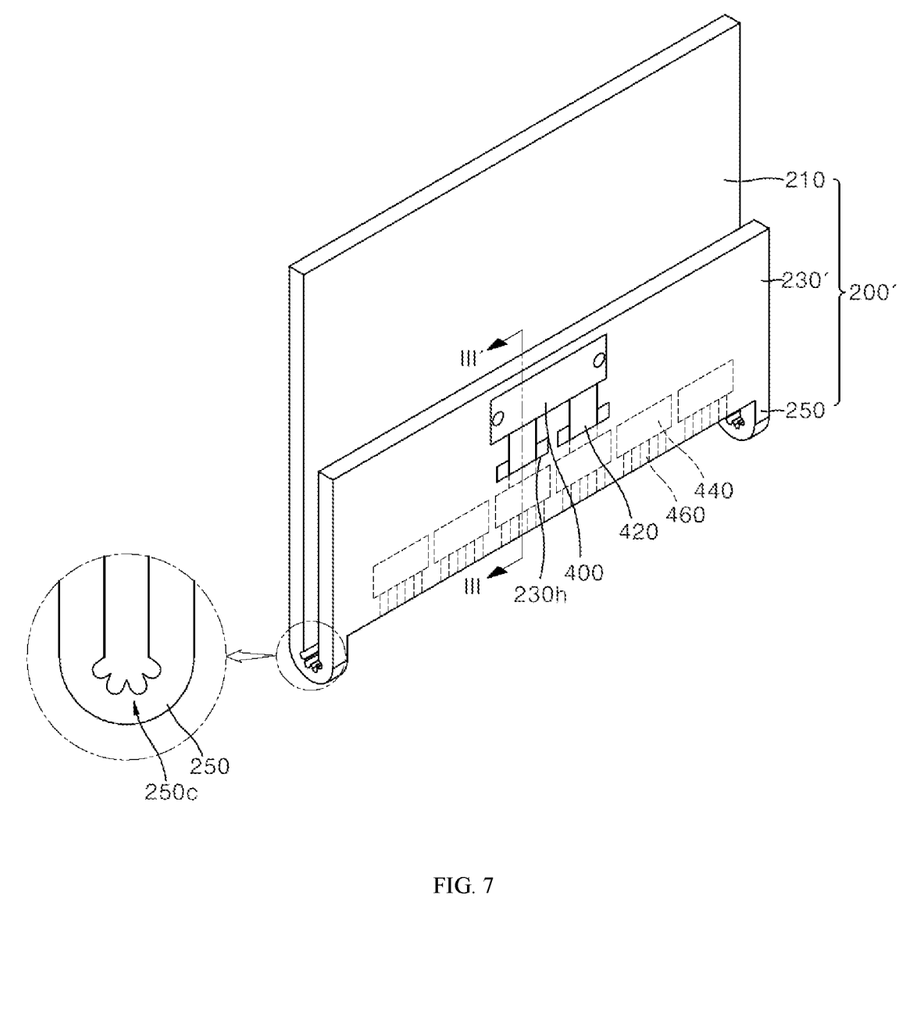
FIG. 7 is a perspective view showing the display device according to the another embodiment of the present disclosure.
Figure 8:
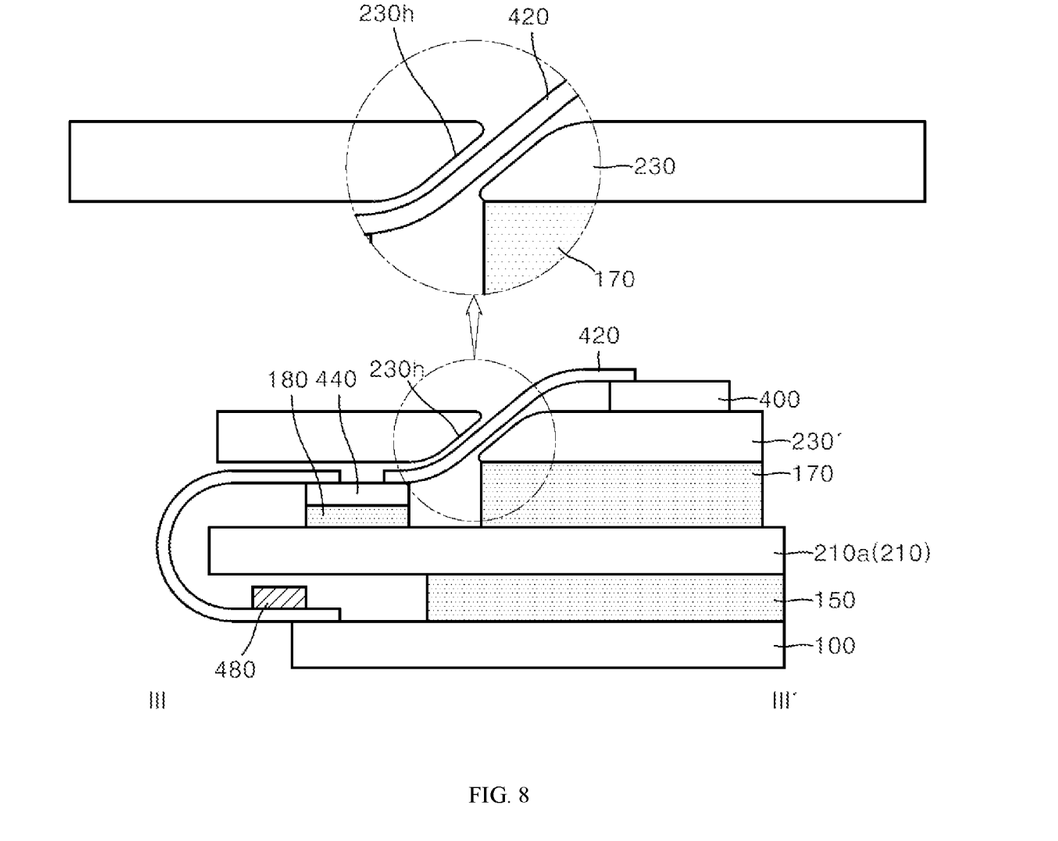
FIG. 8 is a cross-sectional view of the display device cut along a III-III' cutting line of FIG. 6 and FIG. 7.
Figure 9:
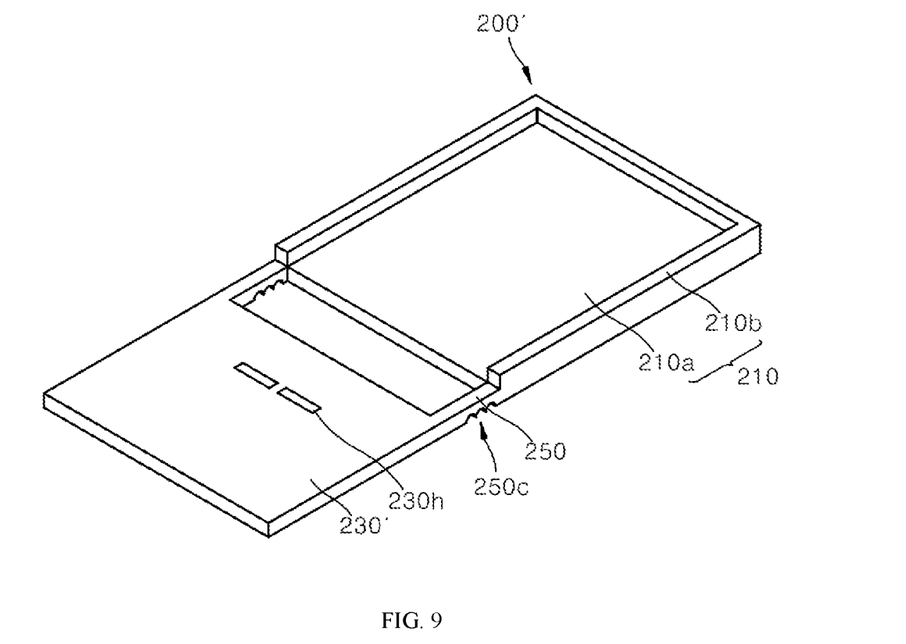
FIG. 9 is a perspective view showing an unfolded state of a back cover according to another embodiment of the present disclosure.

FIG. 6 is a plan view showing a display device according to another embodiment of the present disclosure. FIG. 7 is a perspective view showing the display device according to the another embodiment of the present disclosure. FIG. 8 is a cross-sectional view of the display device cut along a cutting line of FIG. 6 and FIG. 7. FIG. 9 is a perspective view showing an unfolded state of the back cover according to another embodiment of the present disclosure.

The display device according to the another embodiment shown in FIG. 6 to FIG. 9 has a difference in terms of a shape of the back cover, especially a shape of the second back cover, from the display device according to the embodiment shown in FIGS. 1 to 5. Other components have the same or similar configuration as or to those in the embodiment shown in FIGS. 1 to 5. The resulting effects therefrom are the same or similar as or to those in the embodiment shown in FIGS. 1 to 5. Therefore, hereinafter, the display device according to the embodiment shown in FIGS. 6 to 9 will be described mainly on differences from the display device according to the embodiment shown in FIGS. 1 to 5.

Referring to FIG. 6 to FIG. 9, a second back cover 230 according to the present embodiment can have a larger area than that of the second back cover 230 of one embodiment shown in FIGS. 1 to 5. Thus, the second back cover 230 can cover at least one source printed circuit board 440 and can include at least one through-hole 230h. The signal cable 420 connecting the control printed circuit board 400 and the source printed circuit board 440 to each other can pass the through-hole 230h of the second back cover 230.

The through-hole 230h can be formed to be inclined with respect to a top surface and a bottom surface of the second back cover 230. Thus, the signal cable 420 may not be bent at a great angle, but can be bent at a small angle, and can connect the control printed circuit board 400 and the source printed circuit board 440 to each other.

Moreover, each of upper and lower ends of the through-hole 230h can have a curvature. In this way, since each of the upper and lower ends of the through-hole 230h may not be sharp but can have a curvature, for example, the signal cable 420 is not damaged even when the signal cable 420 touches the upper and lower ends of the through-hole 230h during the installation.

Figure 10:
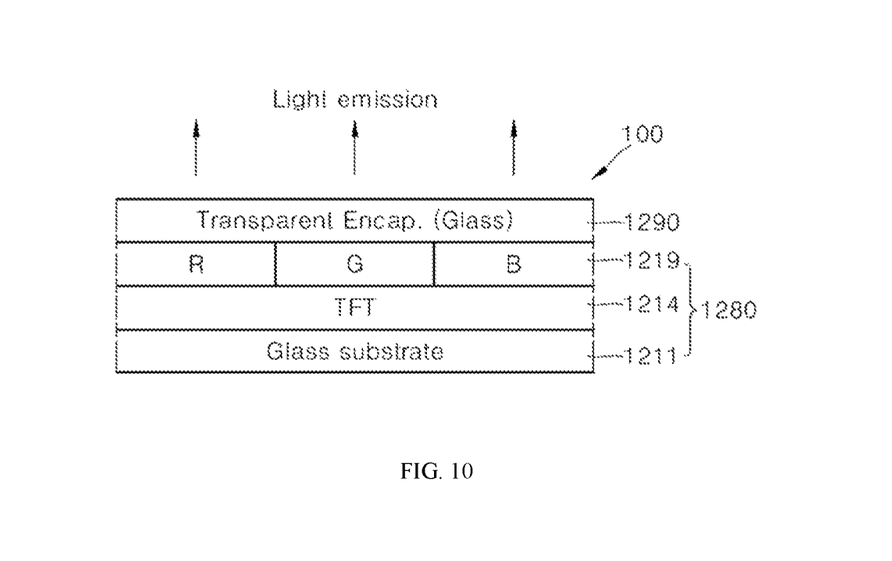
FIG. 10 to FIG. 12 are respectively cross-sectional views schematically showing the structures of organic light-emitting display panels that can be used in display devices according to embodiments of the present disclosure.
Figure 11:
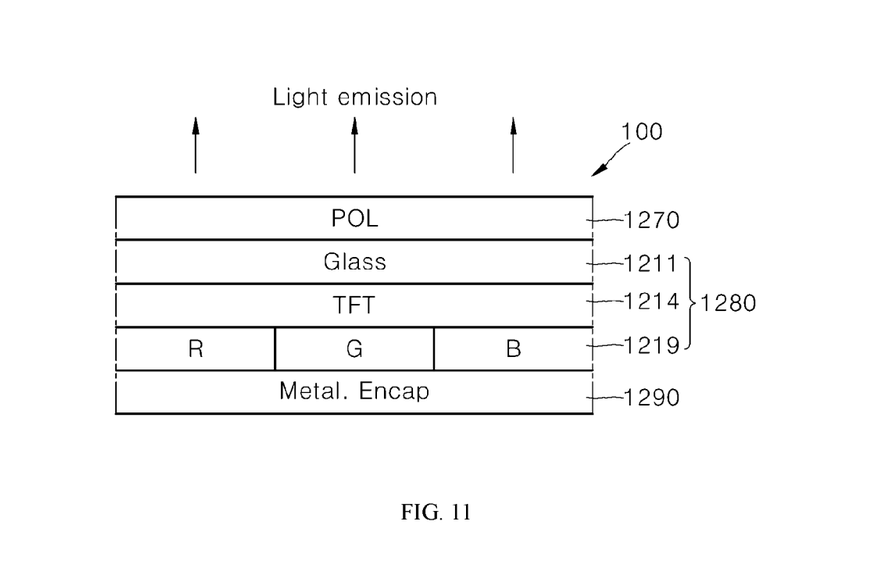
Figure 12:
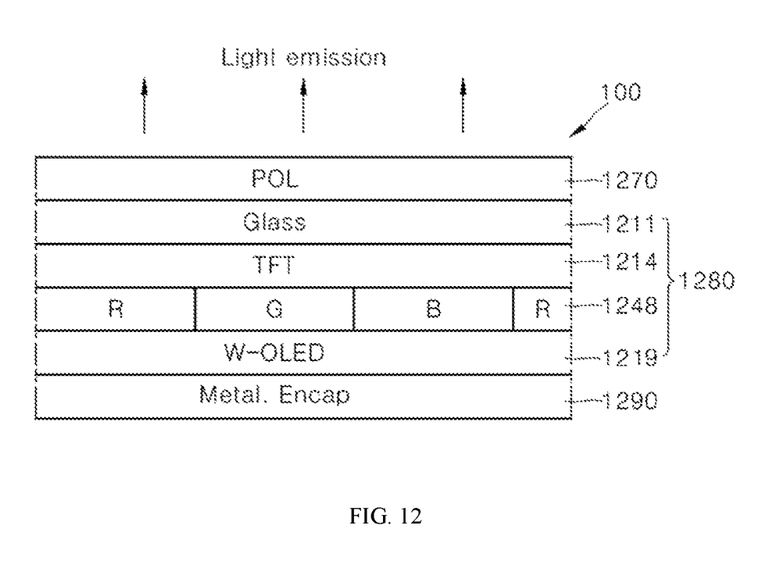

FIG. 10 to FIG. 12 are cross-sectional views schematically respectively showing structures of organic light-emitting display panels used in display devices according to embodiments of the present disclosure.

An organic light-emitting display panel 100 which can be used in one embodiment of the present disclosure can include a substrate, a plurality of thin-film transistors formed on the substrate, a light-emitting layer including an organic light-emitting element layer disposed between both opposing electrode layers and disposed on the thin-film transistor, and an encapsulation layer disposed on the light-emitting layer.

In one example, the organic light-emitting display panel according to the present embodiment can be classified into a top emission type panel and a bottom emission type panel, based on a direction in which light from the organic light-emitting element layer emits.

Briefly, in the top emission scheme, the light generated from the organic light-emitting element layer proceeds in an upward direction as the opposite direction to a direction toward the substrate. One surface of the display panel opposite to the substrate acts as an image display surface.

Conversely, in the bottom emission scheme, light generated from the organic light-emitting element layer proceeds toward the substrate of the panel and travels through the substrate. In this case, an outer surface of the substrate of the panel acts as the image display surface.

FIG. 10 is a cross-sectional view of a top emission type display panel in which light travels in a direction from the substrate of the organic light-emitting display panel to the thin-film transistor TFT.

As shown in FIG. 10, the top emission type organic light-emitting display panel 100 can be configured to include a light-emitting layer 1280, and an encapsulation layer 1290 that is disposed on the light-emitting layer to protect the light-emitting layer.

The light-emitting layer 1280 can act as an array substrate including an organic light-emitting element layer that emits light. The light-emitting layer 1280 includes a glass substrate 1211, a thin-film transistor layer (TFT) 1214 formed on the glass substrate 1211, and an organic light-emitting element layer 1219 disposed on the thin-film transistor layer.

A first electrode (anode or cathode) and a second electrode (cathode or anode) connected to a source or drain electrode of the thin-film transistor are included in the light-emitting layer 1280. The organic light-emitting element layer 1219 is disposed between both the first and second electrodes.

The organic light-emitting element emits light in a self-emission manner due to a difference between potentials of the first and second electrodes under the switching operation of the thin-film transistor.

The substrate made of a glass material prevents the inflow of external moisture and foreign materials. However, external moisture and foreign materials can inflow into the organic light emitting display layer opposite to the glass substrate. Thus, the organic light emitting display layer needs to be protected from the moisture, foreign material, etc.

Thus, the encapsulation layer 1290 as a protective layer is attached to a top surface of the organic light-emitting element layer of the light-emitting layer to prevent the moisture, foreign material, etc. from permeating the organic light-emitting element.

According to the present disclosure, the encapsulation layer is not limited to this term. It should be understood that the encapsulation layer can include a concept including all kinds of protective layers to protect the organic light-emitting element layer of the light-emitting layer constituting the organic light-emitting display panel from the moisture, foreign material, etc. Thus, the encapsulation layer can be expressed as other terms such as a protective layer and a second substrate layer.

In one example, as shown in FIG. 10, in the top emission scheme, light travels in the opposite direction to the glass substrate 1211 of the light-emitting layer, and a top surface of the light-emitting layer can act as an image display surface. The encapsulation layer 1290 is formed on the image display surface side, i.e. a top surface of the organic light-emitting element layer 1219.

Further, as shown in FIG. 10, in the top emission scheme, the encapsulation layer 1290 is disposed on the image display surface side, and thus needs to be transparent. As a result, the encapsulation layer 1290 can or needs to be made of a glass material. Further, in the top emission scheme, the encapsulation layer 1290 can act as the image display surface exposed to the viewer. Thus, the encapsulation layer needs to have rigidity above a certain level so as to be strong against external shocks.

Therefore, in the top emission scheme, the encapsulation layer 1290 needs to be embodied as a glass layer having a relatively larger thickness. In a large sized TV, a thickness of the encapsulation layer 1290 should be at least about 1 mm.

FIG. 11 and FIG. 12 are cross-sectional views of a bottom emission type organic light-emitting display panel. FIG. 11 shows a case where a different organic light-emitting layer is applied for each color. FIG. 12 shows a case where a white organic light-emitting layer W-OLED and a color filter layer are used. Hereinafter, descriptions will be made mainly based on FIG. 11.

As shown in FIG. 11, an organic light-emitting display panel 100 that can be used for the display device according to the present disclosure embodiment can be configured to include an encapsulation layer 1290, a light-emitting layer 1280 disposed on the encapsulation layer 1290, and a polarization layer 1270 disposed on the light-emitting layer 1280.

The light-emitting layer 1280 refers to an array substrate including an organic light-emitting element layer that emits light. The light-emitting layer 1280 can include a glass substrate 1211, and a thin-film transistor (TFT) layer 1214 formed on the substrate 1211, and an organic light-emitting element layer 1219 disposed on the thin-film transistor layer. In the figure, a flipped version of the light-emitting layer 1280 is disposed between the polarization layer 1270 and the encapsulation layer 1290.

Figure 13:
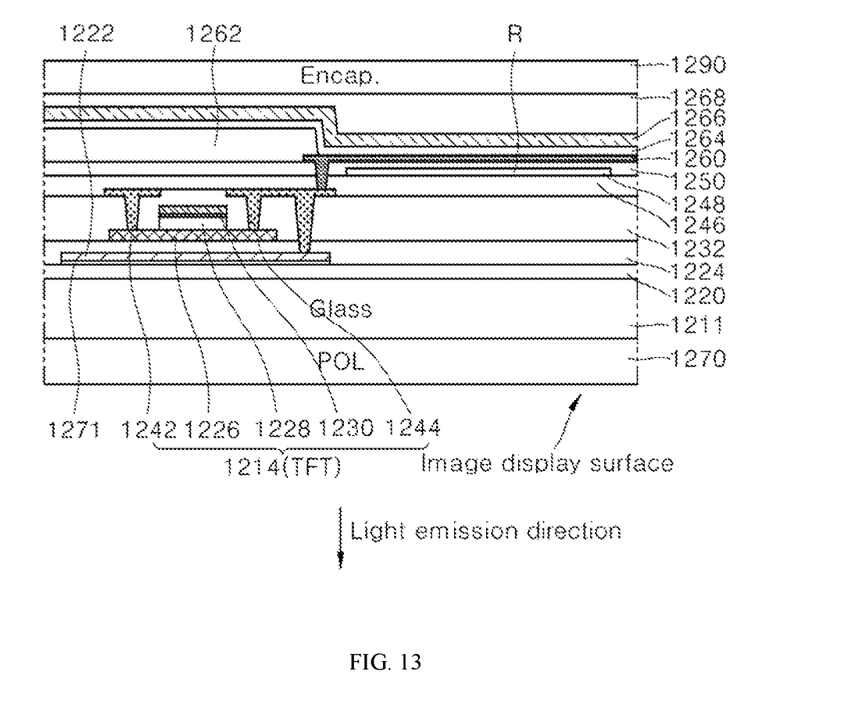
FIG. 13 is a detailed cross-sectional view showing a stack structure of a bottom emission type organic light-emitting display panel that can be used in a display device according to an embodiment of the present disclosure.

As described in more detail in FIG. 13, a first electrode (anode or cathode) and a second electrode (cathode or anode) connected to a source or drain electrode of the thin-film transistor are included in the light-emitting layer 1280. The organic light-emitting element layer 1219 is disposed between the first and second electrodes.

The organic light-emitting element emits light in a self-emission manner due to a difference between potentials of the first and second electrodes under the switching operation of the thin-film transistor.

In this connection, one surface of the polarization layer 1270 can act as the image display surface. The polarization layer 1270, the light-emitting layer 1280 and the encapsulation layer 1290 are sequentially stacked in this order below the image display surface. In some cases, the polarization layer 1270 can be omitted.

In one example, FIG. 11 shows the case where the organic light-emitting element layer 1219 that constitutes the light-emitting layer 1280 without a separate color filter includes organic light-emitting materials that output lights of each color R, G, or B. FIG. 12 shows a case where the organic light-emitting element layer is embodied as the white organic light-emitting element layer 1264 to emit white light, and a color filter layer 1248 is disposed on the white organic light-emitting element layer.

As shown in FIG. 11 and FIG. 12, in the organic light-emitting display panel 100 operating in the bottom emission scheme, the light-emitting layer 1280 can include the substrate 1211, the thin-film transistor layer 1214, and the organic light-emitting element layer 1219 as sequentially arranged under the image display surface.

In this state, light emitted from the organic light-emitting element layer passes through the thin-film transistor layer 1214 and the substrate 1211. Therefore, when it assumed that the substrate 1211 is at a bottom level, light travels toward the substrate. In this way, the device operates in the bottom emission scheme.

In the organic light-emitting display panel 100 operating in the bottom emission scheme, in order to protect the organic light-emitting element layer 1219, the encapsulation layer 1290 is disposed adjacent to the organic light-emitting element layer 1219.

Therefore, in the top emission type device as shown in FIG. 10, the encapsulation layer can act as the image display surface. In the bottom emission type device as shown in FIGS. 11 and 12, the encapsulation layer 1290 is opposite to the image display surface, and thus needs not be made of a transparent material and does not require the rigidity to protect the device from external impact.

For example, the encapsulation layer 1290 in the device operating in the bottom emission scheme can have only the function of preventing moisture or foreign materials from permeating into the organic light-emitting element layer of the light-emitting layer 1280.

Therefore, the encapsulation layer 1290 of the organic light-emitting display panel according to the present embodiment can be implemented as a thin-film made of a metal material and having a second thickness T2 smaller than a first thickness T1 of the encapsulation layer 1290 of the device operating in the top emission scheme as described above.

In fact, the second thickness of the encapsulation layer 1290 of the organic light-emitting display panel according to the present embodiment can be in a range of about 0.05 to 0.2 mm.

Further, the material constituting the encapsulation layer 1290 of the organic light-emitting display panel according to the present embodiment is not limited to metal. The material constituting the encapsulation layer 1290 has no limitation as long as the encapsulation layer 1290 can be formed into a thin thin-film to protect the organic light-emitting element layer.

However, in order to prevent the penetration of hydrogen and oxygen into the organic light-emitting element layer 1219 and thus prevent oxidizing of the organic light-emitting element, the encapsulation layer 1290 can be made of an iron-nickel alloy, so-called Invar metal material that prevents the penetration of hydrogen/oxygen into the organic light-emitting element layer 1219.

Further, it is preferable that the encapsulation layer 1290 is made of a metal material having a reflective property above a certain level.

The light emitted from the organic light-emitting element layer 1219 needs to be output to the image display surface which is opposite to the encapsulation layer 1290. Thus, when the encapsulation layer 1290 is made of a metal material having a reflective property above a certain level, the encapsulation layer 1290 can act as a reflector, thereby improving the light efficiency of the display panel.

In this way, according to the embodiment of the present disclosure, when using the organic light-emitting display panel operating in the bottom emission scheme, the thickness of the encapsulation layer can be reduced, compared to that in the device operating in the top emission scheme as shown in FIG. 10. Thus, there is an advantage of improving the light efficiency of the display panel due to the reflective characteristics of the encapsulation layer 1290.

As shown in FIG. 11 and FIG. 12, the light emitted from the organic light-emitting element layer 1219 needs to be output to the image display surface which is opposite to the encapsulation layer 1290. Thus, when the encapsulation layer 1290 is made of a metal material having a reflective property above a certain level, the encapsulation layer 1290 can act as the reflector, thereby improving the light efficiency of the display panel.

In one example, unlike FIG. 11 having a different organic light-emitting layers applied for each color, FIG. 12 shows an example where the organic light-emitting element layer 1219 is embodied as the white organic light-emitting element layer W-OLED in which emits white light, and the color filter layer 1248 is disposed on the white organic light-emitting element layer W-OLED.

Typically, the light efficiency of the white organic light-emitting elements is superior to those of other color organic light-emitting elements. Thus, when using the structure shown in FIG. 12, the light efficiency of the organic light emitting display device can be further improved.

FIG. 13 is a detailed cross-sectional view showing a stack structure of a bottom emission type organic light-emitting display panel that can be used in a display device according to an embodiment of the present disclosure.

For convenience of illustration, in FIG. 13, the light emission direction is shown as the downward direction or the image display surface is shown as a bottom surface. This is contrary to FIG. 12. However, the present disclosure is not limited thereto.

As shown in FIG. 13, the polarization layer 1270 is placed on the image display surface side. The light-emitting layer 1280 is stacked on the polarization layer 1270 and contacts polarization layer 1270. The encapsulation layer 1290 is placed on the light-emitting layer 1280.

The detailed configuration of the light-emitting layer 1280 of the organic light-emitting display panel operating in the bottom emission scheme used in this embodiment is as follows.

On the substrate 1211 of the light-emitting layer 1280, following components can be disposed: a buffer layer 1220, a light-blocking layer 1222, a first interlayer insulating film 1224, a semiconductor layer 1226, a gate insulating film 1228, a gate electrode 1230, a second interlayer insulating film 1232, a source electrode 1242, a drain electrode 1244, a third interlayer insulating film 1246, a color filter 1248, a planarization layer 1250, a first electrode 1260, a bank 1262, an organic light-emitting element layer 1264, a second electrode 1266, a passivation layer 1268, etc.

In one example, the substrate 1211 of the light-emitting layer 1280 can be a glass substrate. However, the present disclosure is not limited thereto. The substrate 1211 can be a plastic substrate including PET (polyethylene terephthalate), PEN (polyethylene naphthalate), and polyimide.

The buffer layer 1220 functions to prevent the penetration of impurities on the substrate 1211 or to improve interfacial properties and flatness, and can be made of a single layer or multiple layers made of silicon nitride $SiO_x$ or silicon oxide $SiN_x$.

The light-blocking layer 1222 acts to prevent light from being incident to a channel area of the semiconductor layer 1226. To this end, the light-blocking layer 1222 can be made of a non-transparent metal layer to block light. Further, the light-blocking layer 1222 is electrically connected to the drain electrode 1244 to suppress the parasitic capacitance.

The first interlayer insulating film 1224 insulates the light-blocking layer 1222 and the semiconductor layer 1226 from each other. This first interlayer insulating film 1224 includes an insulating material and can be stacked on the buffer layer 1220 and the light-blocking layer 1222.

The semiconductor layer 1226 can be disposed on the first interlayer insulating film 1224 and can include silicon (Si), and can have an active area constituting a channel, and a source area and a drain area doped with high-concentration impurities and respectively disposed on both opposing sides of the active area.

The gate insulating film 1228 insulates the semiconductor layer 1226 and the gate electrode 1230 from each other. This gate insulating film 1228 includes an insulating material and can be stacked on the semiconductor layer 1226.

The gate electrode 1230 is placed on the gate insulating film 1228 and receives a gate voltage from a gate line.

The second interlayer insulating film 1232 protects the gate electrode 1230, and insulates the gate electrode 1230, the source electrode 1242 and the drain electrode 1244 from each other. This second interlayer insulating film 1232 includes an insulating material, and can be stacked on the first interlayer insulating film 1224, the semiconductor layer 1226, and the gate electrode 1230.

Each of the source electrode 1242 and the drain electrode 1244 is disposed on the second interlayer insulating film 1232 and can contact the semiconductor layer 1226 respectively via first and second contact holes formed in the second interlayer insulating film 1232. Further, the drain electrode 1244 can contact the light-blocking layer 1222 via a third contact hole.

The source electrode 1242 and the drain electrode 1244, the semiconductor layer 1226 in contact with these electrodes, the gate insulating film 1228 and the gate electrode 1230 formed on the semiconductor layer 1226, etc. can constitute the thin-film transistor layer 1214.

The third interlayer insulating film 1246 protects the source electrode 1242 and the drain electrode 1244.

The color filter 1248 can be disposed on the second interlayer insulating film 1232 and at a position overlapping with the organic light-emitting element layer 1216 to change the color of light emitting toward the substrate 1211 in the device operating in the bottom emission scheme.

The planarization layer 1250 protects the source electrode 1242 and the drain electrode 1244 and planarizes a surface on which the first electrode 1260 is placed.

The first electrode 1260 can be placed on the planarization layer 1250, and can contact the drain electrode 1244 via a fourth contact hole formed in the planarization layer 1250. Further, the first electrode 1260 serves as the anode. The first electrode can be made of a transparent conductive material having a relatively higher work function value, such that the light generated from the organic light-emitting element layer 1264 transmits through the first electrode.

For example, the first electrode 1260 can be made of a metal oxide such as ITO (Indium Tin Oxide) or IZO (Indium Zinc Oxide), a mixture of a metal and an oxide such as ZnO:Al or $SnO_2$:Sb, or conductive polymer such as poly(3-methylthiophene), poly[3,4(-ethylene-1,2-dioxy)thiophene] (PEDT), polypyrrole, and polyaniline. Alternatively, the first electrode 260 can be made of a carbon nanotube (CNT), graphene, silver nanowire, or the like.

The organic light-emitting element layer 1264 can be placed on the first electrode 1260, and can be composed of a single layer made of a light-emitting material, or can be composed of multiple layers including a hole injection layer, a hole transport layer, a light-emitting layer, an electron transport layer, and an electron injection layer. This organic light-emitting element layer 1264 can be embodied as a white organic light-emitting element layer that outputs white light and may not be patterned but can be applied on the entire surface of the substrate. This organic light-emitting element layer 1264 is not subjected to the patterning process, thereby obtaining a simple manufacturing process or achieving a cost reduction.

The second electrode 1266 can be placed on the organic light-emitting element layer 1264, and can act as the cathode, and can be made of a conductive material having a relatively lower work function value. The second electrode 1266 can be embodied as a single layer made of a single metal such as silver (Ag) or an alloy composed of a certain content of magnesium (Mg) or as a plurality of layers made thereof.

The first electrode 1260 connected to the thin-film transistor, the second electrode 1266 disposed opposite to the first electrode 1260, and the organic light-emitting element layer 1264 interposed between the first electrode 1260 and the second electrode 1266 are collectively referred to as an organic light-emitting element.

In the organic light-emitting element layer 1264, when a predefined voltage is applied across the first electrode 1260 and the second electrode 1266, holes injected from the first electrode 1260 and electrons provided from the second electrode 1266 are transferred to the organic light-emitting element layer 1264 to form excitons. When the excitons transition from an excited state to a ground state, light can be generated and can be emitted in a form of visible light.

The bank 1262 can be formed on an edge of the first electrode 1260. An opening can be defined in the bank to partially expose the first electrode 1260. For example, the bank 1262 can be made of inorganic insulating materials such as $SiO_x$, $SiN_x$, and SiON.

The passivation layer 1268 can serve to protect the organic layer from moisture and oxygen and can have a multi-layer structure made of an inorganic material, an organic material, and a mixture thereof.

In one example, a single low reflectivity layer 1271 can be disposed on each of the light-blocking layer 1222, the gate electrode 1230, the source electrode 1242, and the drain electrode 1244. This low reflectivity layer prevents reflection of external light, thereby preventing problems such as decrease in visibility, decrease in luminance, and decrease in contrast ratio.

The low reflectivity layer 1271 can be made of a material that absorbs external light introduced through the substrate 1211, or can be coated with a light absorber. The external light can mean non-polarized light which does not pass through a polarizing plate or a polarizing layer.

The material absorbing the external light can include a metal absorbing light or an alloy thereof and can have a black-based color. For example, the low reflectivity layer 1271 can be made of any one of molybdenum (Mo), chromium (Cr), titanium (Ti), niobium (Nb), manganese (Mn), tantalum (Ta), or an alloy thereof. However, embodiments are not limited thereto. The low reflectivity layer can be made of any other metal that can absorb light. Accordingly, the low reflectivity layer 1271 can prevent external light from being reflected back toward the outside.

Further, this low reflectivity layer 1271 can be made of a metal oxide or an alloy of a metal absorbing the light and a metal oxide, and can block light introduced from the outside. The low reflectivity layer 1271 can be made of, for example, a metal oxide such as ITO (Indium Tin Oxide), IZO (Indium Zinc Oxide), and ITZO (Indium Tin Zinc Oxide). Destructive interference between the light reflected from the surface of the low reflectivity layer 1271 and the light passing through the low reflectivity layer 1271 and then reflected from the interface between the conductive layer and the low reflectivity layer 1271 can occur. Thus, the external light may not be able to travel to the outside.

In one example, the organic light-emitting display panel 100 according to the present embodiment can further include a transmittance adjustment film and/or a transparent multilayer film that is disposed on the substrate 1211 to absorb light of the visible wavelength.

The transmittance adjustment film has a predefined transmittance and thus can absorb light incident on the substrate 1211 from the outside and thus greatly reduce the reflectance of the substrate 1211 via the external light absorption.

The transparent multilayer film has a structure in which a plurality of refractive layers having different refractive indices are stacked one on top of another, and thus functions to reduce the reflectance of external light by extinguishing external light via destructive interference between light beams respectively reflected from the refractive layers having different refractive indices.

The transmittance adjustment film and/or the transparent multilayer film can constitute the polarization layer 1270 itself or a portion thereof.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments.

Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display device, comprising:
   a display panel; and
   a back cover to support the display panel,
   wherein the back cover includes:
   a first back cover stacked on the display panel; and
   a second back cover stacked on the first back cover; and
   a connector configured to connect a portion of the first back cover and a portion of the second back cover,
   wherein the back cover has thermal conductivity, and
   wherein the first back cover, the second back cover and the connector are integrally formed with each other.

2. The display device of claim 1, wherein the first back cover is attached to the display panel via a first adhesive member, and
   wherein the second back cover has a smaller area than an area of the first back cover, and is attached to the first back cover via a second adhesive member.

3. The display device of claim 2, wherein the first adhesive member includes a heat dissipation material.

4. The display device of claim 1, wherein the connector is located adjacent to a lower end of the display panel, and
   wherein a bottom of the connector protrudes downwardly beyond a lower end of the display panel.

5. The display device of claim 4, wherein the connector is bent, and at least one corrugation is disposed on an inner surface of a bent portion of the connector.

6. The display device of claim 1, wherein the first back cover includes:
   an inner region attached to the display panel; and
   an edge region surrounding a portion of edges of the display panel,
   wherein the display device further comprises a sealing member configured to minimize moisture permeation between the display panel and the edge of the first back cover.

7. The display device of claim 1, wherein a source printed circuit board is attached to the first back cover, while a control printed circuit board is attached to the second back cover.

8. The display device of claim 7, wherein the second back cover does not cover the source printed circuit board, and
   wherein a signal cable for connecting the control printed circuit board and the source printed circuit board to each other passes by a lower end of the second back cover.

9. The display device of claim 7, wherein the second back cover covers the source printed circuit board, and has at least one through-hole defined therein, and
   wherein a signal cable for connecting the control printed circuit board and the source printed circuit board to each other passes through the at least one through-hole.

10. The display device of claim 9, wherein each of upper and lower ends of the at least one through-hole has a curvature.

11. The display device of claim 10, wherein the at least one through-hole extends in an inclined manner relative to a top surface and a bottom surface of the second back cover.

12. The display device of claim 1, wherein the back cover includes:
    aluminum, copper, or an alloy thereof; or
    a clad metal in which aluminum, copper, or an alloy thereof is laminated; or
    a steel plate material including galvanized steel, aluminum plated steel, or galvalume steel.

13. The display device of claim 12, wherein the back cover includes a PCM (Pre-Coated Metal) material as a color steel plate material obtained by coating a resin on the steel plate material or attaching a film on the steel plate material.

14. A display device, comprising:
    a display panel;
    a back cover having thermal conductivity and including:
    a first back cover including:
    an inner region attached to the display panel via a first adhesive member, and
    an edge region surrounding a portion of edges of the display panel;
    a second back cover attached to a rear surface of the first back cover via a second adhesive member; and
    a connector located adjacent to a lower end of the display panel,
    wherein the connector connects a portion of the first back cover and a portion of the second back cover to each other, and
    wherein the first back cover, the second back cover and the connector are integrally formed with each other.

15. The display device of claim 14, wherein an area of the second back cover is smaller than an area of the first back cover.

16. The display device of claim 14, wherein a lower end of the connector protrudes downwardly beyond a lower end of the display panel.

17. The display device of claim 14, wherein the connector is bent, and at least one corrugation is disposed on an inner surface of a bent portion of the connector.

18. The display device of claim 14, wherein the display device further comprises a sealing member configured to minimize moisture permeation between top and right and left edges of the display panel and the edge region of the first back cover.

19. The display device of claim 14, wherein a source printed circuit board is attached to the first back cover, while a control printed circuit board is attached to the second back cover.

20. The display device of claim 19, wherein the second back cover does not cover the source printed circuit board, and
    wherein a signal cable connecting the control printed circuit board and the source printed circuit board to each other passes by a lower end of the second back cover.

21. The display device of claim 19, wherein the second back cover covers the source printed circuit board, and has at least one through-hole defined therein, and
    wherein a signal cable configured to connect the control printed circuit board and the source printed circuit board to each other passes through the at least one through-hole.

22. The display device of claim 21, wherein each of upper and lower ends of the at least one through-hole has a curvature.

23. The display device of claim 22, wherein the at least one through-hole extends in an inclined manner relative to a top surface and a bottom surface of the second back cover.

24. The display device of claim 14, wherein the first adhesive member includes a heat dissipation material.

* * * * *